United States Patent [19]

Ueno et al.

[11] Patent Number: 4,765,860

[45] Date of Patent: Aug. 23, 1988

[54] METHOD OF MAKING A FLEXIBLE BASE PLATE FOR PRINTED CIRCUIT BOARD

[76] Inventors: Susumu Ueno, 1, Oaza Touwada, Kamisu-cho, Kashima-gun, Ibaraki-ken; Hajime Kitamura, 6-14-2, Aobadai, Ichihara-shi, Chiba-ken; Kaname Inoue, 5-18-10-404, Arima, Miyamae-ku, Kawasaki-shi, Kanagawa-ken, all of Japan

[21] Appl. No.: 115,659

[22] Filed: Oct. 27, 1987

Related U.S. Application Data

[63] Continuation of Ser. No. 606,652, May 3, 1984, abandoned.

[30] Foreign Application Priority Data

May 6, 1983 [JP] Japan .................................. 58-79151

[51] Int. Cl.⁴ .......................... B05D 3/06; B32B 31/28
[52] U.S. Cl. .............................. 156/272.6; 156/274.8; 156/307.3; 156/322; 204/165; 427/40
[58] Field of Search .................. 204/165, 168–169; 427/38–41; 156/630, 632, 272.6, 307.7, 273.3, 274.4, 274.8, 275.7, 307.3, 308.2, 320, 285, 322, 286; 250/492.1, 324–326

[56] References Cited

U.S. PATENT DOCUMENTS

| | | | |
|---|---|---|---|
| 3,660,190 | 5/1972 | Stroszynski | 156/272.6 |
| 4,087,300 | 5/1978 | Adler | 156/307.7 |
| 4,374,694 | 2/1983 | Blenner | 156/272.6 |

OTHER PUBLICATIONS

Coopes et al., *Gas Plasma Treatment of Polymer Surface*, 1982, 217–226.

*Primary Examiner*—Merrell C. Cashion, Jr.

[57] ABSTRACT

The invention provides a method for the preparation of a flexible base for printed circuit board of the type formed of lamination of a flexible sheet-like polymeric base and a metal, e.g. copper, foil adhesively bonded to the surface thereof by use of an adhesive, in which the surface of the polymeric base prior to bonding of the metal foil is subjected to exposure to low temperature plasma so that the adhesive bonding strength between the polymeric base and the metal foil can be greatly improved.

1 Claim, 1 Drawing Sheet

FIGURE
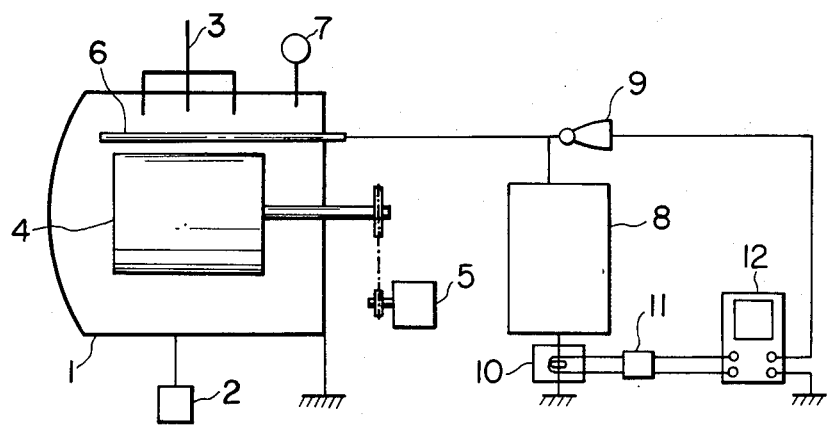

4,765,860

METHOD OF MAKING A FLEXIBLE BASE PLATE FOR PRINTED CIRCUIT BOARD

This application is a continuation, of application Ser. No. 606,652, filed May 3, 1984, now abandoned.

BACKGROUND OF THE INVENTION

The present invention relates to a flexible base plate for printed circuit board and a method for the preparation thereof. More particularly, the present invention relates to a flexible base plate for printed circuit board composed of a film or sheet of a plastic resin with flexibility and a metal foil firmly bonded to the plastic film or sheet with an adhesive.

One of the problems in the flexible base plates for printed circuit board of the above described type is the strength of adhesive bonding between the film- or sheet-like base of a plastic resin and the metal foil. Several methods have been proposed for the improvement of the adhesive bonding in the prior art in which the surface of the plastic base is subjected to certain treatments prior to adhesive bonding with the metal foil both by a chemical and by a physical means including a treatment with an alkali such as sodium hydroxide or chromic acid mixture, treatment with corona discharge and mechanical treatment for matting of the surface by sand blasting or grinding with a sand cloth.

Each of these prior art methods has disadvantages and problems. For example, the methods by the chemical means have problems that the composition or nature of the treatment solution, e.g. an alkali solution or chromic acid mixture, gradually changes in the course of repeated use of the solution to cause non-uniformity in the effectiveness of the treatment presenting a difficult problem in the quality control of the products. In addition, disposal of spent solutions requires elaborate and expensive facilities since otherwise a serious problem of environmental pollution is unavoidable. The method of treatment with corona discharge is, although this method was considered promising in the early stage of its debut, not practically undertaken for the preparation of flexible bases of printed circuit board due to the gradual loss of the effect on the improvement of adhesion along with the disappearance of the elecric charge once accumulated on the surface.

The mechanical matting method of the surface of the plastic base by sand blasting or grinding with a sand cloth is, on the other hand, free from the above described problems in the other methods but the method has its own disadvantages that the mechanical strength of the plastic base may possibly be decreased by the mechanical working in addition to a problem of troubles in the succeeding process of the adhesive bonding of a metal foil and preparation of a printed circuit board caused by the particles of the sanding or grinding powder such as silicon carbide eventually left on the surface of the plastic base after sanding or grinding. This problem can be obviated only by carefully repeating washing or cleaning to remove the abrasive particles from the surface of the plastic base.

Beside the above described problems inherent to the respective methods for the surface treatment of the plastic base, it is of course essential that the surface treating method has no adverse influences on the properties of the plastic base per se for the printed circuit board such as flexibility, heat resistance in view of the possibility of contacting with molten solder alloy, resistance against chemicals including solvents, acids and alkalis and flame retardancy. Therefore, none of the prior art methods is quite satisfactory from the standpoint of practical application.

Taking the flexible bases of a copper-foiled polyimide resin film or sheet as an example of the base material of printed circuit boards currently under wide practical use, an adhesive bonding strength or peeling resistance of 1.3 kg/cm can be usually obtained between the polyimide resin base and the copper foil when an adhesive of an epoxy-modified nylon resin is used on the surface of the resin base subjected to the sanding treatment in advance. This adhesion strength is, however, not sufficiently high in consideration of the recent trend toward higher and higher density of the printed circuit wiring in compliance with the demand for more and more compact design of electronic instruments including ICs and LSIs with increased density of integration. For example, the width of the copper foil wiring on a printed circuit board is required to be 100 $\mu$m or smaller so that the above mentioned peeling resistance of 1.3 kg/cm is only 13 g for each copper foil wiring of 100 $\mu$m width. Therefore, such a printed circuit board causes troubles when used in an electronic instrument under vibration or bending as in a printer head.

SUMMARY OF THE INVENTION

An object of the present invention is therefore to provide a flexible base for printed circuit board composed of a film or sheet of a plastic resin and a metal foil adhesively bonded to the plastic base, in which the adhesive bonding strength between the plastic base and the metal foil is outstandingly high in comparison with the plastic bases for printed circuit board in the prior art.

Another object of the invention is to provide a novel and improved method for the preparation of a flexible base for printed circuit board as mentioned above in a very simple and inexpensive way.

Thus, the method of the present invention comprises subjecting the surface of a plastic base in the form of a film or sheet having flexibility to exposure to an atmosphere of low temperature plasma; and bonding a metal foil to the thus plasma-treated surface of the plastic base with a layer of a adhesive intervening therebetween.

BRIEF DESCRIPTION OF THE DRAWING

The figure is a schematic illustration of an apparatus for generation of low temperature plasma used in practicing the method of the present invention.

DETAILED DESCRIPTION OF THE PREFERRED EMBODIMENTS

According to the above described method of the present invention, several advantages are obtained that there is absolutely no problem in the disposal of a spent solution used in the chemical treatment such as the waste alkali solution and chromic acid mixture after the chemical treatments because the inventive method is a dry process without using such a treatment solution, that there is no danger or trouble caused by particles of foreign materials left on the surface of the plastic base such as the abrasive particles in the sand blasting or grinding with a sand cloth because the inventive method is performed merely by exposing the surface of the plastic base to an atmosphere of low temperature plasma, that the inventive method can readily be practiced in a continuous process including the steps of the low temperature plasma treatment of the plastic base, application of an adhesive to the thus plasma-treated surface, drying of the adhesive, pressure-bonding of a copper foil to the plastic base on the surface provided with the adhesive and post-curing by use of a continuous processing-type apparatus for low temperature plasma treatment, that, in the case of a copper-foiled polyimide resin base, the adhesive bonding strength or peeling resistance between the resin base and the copper foil can be as high as 1.5 to 3.0 kg/cm and that, consequently, the wiring density of the printed circuit board can be greatly increased with improved reliability suitable for use in any precision connector devices.

The flexible plastic base in the form of a film or sheet may be fabricated of a variety of plastic materials which should preferably have a softening point of 120° C. or higher exemplified by polyester films, polyimide films and polytetrafluoroethylene films. It is optional that the plastic film may be reinforced with a reinforcing material of other types such as glass fibers, glass cloths and glass mats as in a glass fiber-reinforced flexible epoxy resin sheet.

The first step of the inventive method is the treatment of the above mentioned plastic base with low temperature plasma generated in a low pressure atmosphere of an inorganic gas under flowing by applying an electric voltage between the electrodes of the plasma chamber to effect glow discharge. It is preferable in order to obtain a highly improved adhesive bonding strength between the plasma-treated surface of the plastic base and a metal foil that the voltage applied between the electrodes installed inside the plasma chamber is 4000 volts or higher. By undertaking such specific conditions of the plasma discharge, a very remarkable effect of improvement can be obtained in the adhesive bonding strength between the plastic base and the metal foil within a short time of the plasma treatment.

The inorganic gas for supporting the plasma discharge is exemplified by helium, neon, argon, nitrogen, oxygen, air, nitrous oxide, nitrogen monoxide, nitrogen dioxide, carbon monoxide, carbon dioxide, bromine cyanide, sulfur dioxide, hydrogen sulfide and the like and these inorganic gases may be used either singly or as a mixture of two kinds or more according to need.

In the method of the present invention, oxygen is particularly effective as the plasma-supporting inorganic gas among the above named gases in respect of the effectiveness of the plasma treatment so that the inorganic gas introduced into the plasma chamber should preferably be pure oxygen gas or a gaseous mixture containing at least 10% by volume of oxygen. Organic gases may be admixed with an inorganic gas although the mixing amount thereof should be limited.

The pressure of the plasma-supporting gas in the plasma chamber should be in the range from 0.001 to 10 Torr or, preferably, from 0.01 to 1 Torr. The electric power supply to the electrodes inside the plasma chamber to produce stable glow discharge should be from 10 watts to 100 kilowatts depending on the type and size of the apparatus at a high frequency of, for example, from 10 kHz to 100 MHz. The frequency band is of course not limited to the above mentioned high frequency but any frequency of direct current or low frequency to microwaves is suitable for the generation of low temperature plasma.

The electrodes to which the above mentioned electric power is supplied should preferably be installed inside the plasma chamber though not limited thereto and may be installed outside the plsama chamber. A single coiled electrode surrounding the plasma chamber may be used. The connection of the electrodes to the power generator may be either by the capacitive coupling or by the inductive coupling. The form of the electrodes is not particularly limitative including plates, rings, rods, cylinders and the like and each of the electrodes may be in the same form as or in a different form from the other. A convenient disposition of the electrodes is that the inner walls of the plasma chamber are made of a metal to serve as one of the electrodes which is usually electrically grounded and the other electrode is installed inside the plasma chamber as elecrically insulated from the chamber walls.

It is necessary that the power electrode is provided with an insulating coating on the surface with an electrically insulating material having a considerably high dielectric strength in order to maintain stable electric discharge to generate low temperature plasma in the atmosphere by the application of a voltage of 4000 volts or higher between the electrodes. When the surface of a metal-made electrode is exposed bare without insulating coating, glow discharge can be performed with stability only with impression of a relatively low voltage of, for example, 1000 volts or lower between the electrodes and impression of a higher voltage may result in arc discharge with which no low temperature plasma can be generated.

The material of the insulating coating provided on the electrode of copper, steel aluminum or other metal should preferably be porcelain enamel, glass, ceramic and the like and the dielectric strength of the material should preferably be at least 10000 volts/mm in the impression of a direct current voltage.

In addition to the condition of the atmospheric pressure of 0.001 to 10 Torr in the plasma chamber, the conditions to maintain generation of low temperature plasma with stability with impression of a discharge voltage of 4000 volts or higher between the electrodes to effect glow discharge include conditions in the power density on the electrode surface and the distance between the electrodes that the density of power consumption on the surface of the power electrode is preferably at least 2.5 watts per $cm^2$ and the distance between the electrodes is preferably in the range from 1 to 20 cm.

When the gaseous pressure in the atmosphere is larger than 10 Torr, an excessively large electric power is consumed to generate low temperature plasma in the atmosphere with a large quantity of heat evolution which may adversely affect the material under the plasma treatment. When the pressure is lower than 0.001 Torr, on the other hand, stability can hardly be obtained in the electric discharge so that, at any rate, no sufficient effect of the desired improvement can be obtained in the adhesive bonding strength between the plastic base and the metal foil. When the density of the power consumption on the surface of the discharge electrode is smaller than 2.5 watts/$cm^2$, the high voltage discharge can hardly be maintained with stability so that the desired effect of adhesion improvement cannot be obtained. Further, the distance between the electrodes should be in the range from 1 to 20 cm because a too small distance therebetween may have an adverse thermal influence on the plastic base under treatment in addition to the difficulty in the operation of the apparatus while an excessively large distance between electrodes unavoidably results in a large loss in the power consumption which can be compensated only by increasing the capacity of the apparatus accompanied by an economical disadvantage.

The flexible base plate for printed circuit board according to the present invention can be obtained by integrally bonding a metal foil and the plastic base having been treated with low temperature plasma in the above described manner by means of an adhesive therebetween. The metal foil suitable for use is exemplified by copper foils, e.g. electrolytic and rolled copper foils, and foils of other metals such as gold, silver, nickel, aluminum, tin and zinc as well as metal layers formed by plating.

The adhesive suitable for use in this case is exemplified by thermosetting adhesives including polyester resins, polyurethane resins, epoxy resins, phenolic resins and silicone resins as well as those modified resins based on the above named resins and thermopolastic adhesives including polyamide resins, ethylene-vinyl acetate copolymeric resins, ethylene-acrylate copolymeric resins, ethylene-glycidyl methacrylate-vinyl acetate copolymeric resins and ionomer resins.

When adhesive bonding of the plastic base and the metal foil is performed, a layer of the adhesive is formed on the surface of the plastic base having been treated with the low temperature plasma by the application of the adhesive to the surface followed by evaporation of the solvent contained therein or by other methods and the metal foil is applied and pressed on to the adhesive layer to effect curing of the adhesive at room temperature or at an elevated temperature.

In the following, examples are given to illustrate the inventive method in mor detail although the inventive method is never limited thereto. The apparatus used in the examples is schematically illustrated in the accompanying drawing. The apparatus used for the low temperature plasma treatment has a plasma chamber 1 made of a stainless steel which is constructed in such a manner that it can be evacuated by means of a vacuum pump 2 down to a pressure of 0.001 Torr or below and provided with a gas inlet tube 3 through which the plasma-supporting gas is introduced into the plasma chamber 1 out of a plurality of nozzles (three nozzles in the figure) to form divided gas flows with increased uniformity according to need. A rotatable cylindrical cathod 4 made of a stainless steel is installed inside the plasma chamber 1 and rotated by means of a driving unit 5 at a continuously variable velocity. The cylindrical cathode 4 is electrically grounded through the plasma chamber 1. It is also preferable that the cylindrical cathode 4 has such a structure that the temperature thereof can be controlled by passing hot or cold water through inside. Being electrically insulated from the plasma chamber 1 and the cylindrical cathode 4, a rod-like electrode 6 is provided inside the plasma chamber to face the cylindrical cathode 4 keeping a uniform gap therebetween. The pressure inside the plasma chamber can be monitored and recorded by means of a Pirani vacuum gauge 7 communicating with the plasma chamber 1. The high frequency electric power supplied to the electrodes is obtained from the high frequency power generator 8 installed outside the plasma chamber 1. The discharge voltage and the discharge current are monitored and measured by means of the assembly composed of a high voltage probe 9, such as the Model HV-P-30 manufactured by Iwasaki Tsushinki Co., a current probe 10, such as the Model CO-502 manufactured by the same company, and a termination 11, such as the Model CP-512 manufactured by the same company, connected to a two-channel synchroscope 12.

EXAMPLE 1

A polyimide resin film having a thickness of 50 $\mu$m was applied on to the surface of the cylindrical cathode of the apparatus for the low temperature plasma treatment as described above and the plasma chamber was evacuated by means of the vacuum pump. When the pressure inside the plasma chamber had reached 0.01 Torr, oxygen gas was introduced into the plasma chamber from the gas inlet tube at a constant rate of 500 ml/minute so that the pressure inside the plasma chamber was kept constant at 0.13 Torr by the balance of the continuous evacuation and introduction of the gas. While keeping the atmospheric condition as described above and rotating the cylindrical cathode, a high frequency electric power of 13 kilowatts at a frequency of 150 kHz was supplied to the electrodes to generate low temperature plasma inside the plasma chamber to which the surface of the polyimide resin film was exposed for 15 seconds. The discharge voltage produced in this case between the electrodes was 9000 volts.

The thus plasma-treated surface of the polyimide resin film was coated with an epoxy-based adhesive (Bond E Setclear manufactured by Konishi & Co.) and an electrolytic copper foil was adhesively bonded thereto under pressure followed by curing of the adhesive at room temperature for 48 hours to give a flexible base sheet for printed circuit board.

The thus prepared copper-foiled flexible base for printed circuit board was subjected to the test of the adhesive bonding strength between the copper foil and the polyimide resin film by T-wise peeling according to the procedure specified in JIS K 6854 to give a value of the peeling resistance of 2.95 kg/cm. Further, the base sheet was subjected to the test of heat resistance in contact with a molten solder alloy to find that no noticeable change was found by contacting therewith at 260° C. for 10 seconds.

Several flexible base sheets wer further prepared in the same manner as above except that the discharge voltage between the electrodes was decreased to 7000, 5000 and 3000 volts and one more base sheet was prepared without the low temperature plasma treatment of the polyimide resin film. The results of the adhesive bonding strength test by T-wise peeling undertaken with these flexible base sheets were 2.05, 1.24, 0.83 and 0.80 kg/cm for the base sheets prepared at the discharge voltage of 7000, 5000 and 3000 volts and prepared without the low temperature plasma treatment, respectively.

EXAMPLE 2

A polyimide resin film having a thickness of 25 $\mu$m was applied on to the surface of the cylindrical cathode of the above described apparatus for low temperature plasma treatment and the plasma chamber was evacuated by means of the vacuum pump. When the pressure inside the plasma chamber had reached 0.01 Torr, argon gas was introduced into the plasma chamber from the gas inlet tube at a constant rate of 100 ml/minute so that the pressure inside the plasma chamber was kept constant at 0.06 Torr. While keeping the atmospheric condition as described above and rotating the cylindrical cathode, a high frequency electric power of 7 kilowatts at a frequency of 200 kHz was supplied to the electrodes to generate low temperature plasma inside the plasma chamber to which the surface of the resin film was exposed for 1 minute. The discharge voltage produced in this case between the electrodes was 5000 volts.

An electrolytic copper foil was press-bonded to the surface of the thus plasma-treated polyimide resin film by use of a hot-melt type adhesive to give a flexible base sheet for printed circuit board.

The thus prepared copper-foiled base sheet was subjected to the test of the adhesive bonding strength between the copper foil and the resin film by T-wise peeling to give a value of 2.20 kg/cm which was more than twice as large as the value of 0.90 kg/cm in a similar copper-foiled base sheet prepared without plasma treatment. Further, the base sheet prepared with the plasma treatment was subjected to the test of heat resistance in contact with a molten solder alloy to note that no noticeable change was found by contacting therewith at 260° C. for 10 seconds.

EXAMPLE 4

A polyester resin film having a thickness of 25 μm was applied on to the surface of the cylindrical cathode of the above described apparatus for low temperature plasma treatment and the plasma chamber was evacuated by means of the vacuum pump. When the pressure inside the plasma chamber had reached 0.01 Torr, air was introduced into the plasma chamber through the gas inlet tube at a constant rate of 300 ml/minute so that the pressure inside the plasma chamber was kept constant at 0.10 Torr. While keeping the atmospheric condition inside the plasma chamber as described above and rotating the cylindrical cathode, a high frequency electric power of 10 kilowatts at a frequency of 110 kHz was supplied to the electrodes to generate low temperature plasma inside the plasma chamber to which the surface of the polyester resin film was exposed for 30 seconds. The discharge voltage produced in this case between the electrodes was 7000 volts.

A rolled copper foil was adhesively bonded to the thus plasma-treated surface of the polyester resin film by use of the same adhesive as used in Example 1 followed by curing of the adhesive by standing at room temperature for 48 hours to give a flexible base sheet for printed circuit board.

The thus prepared copper-foiled flexible base sheet for printed circuit board was subjected to the test of the adhesive bonding strength between the copper foil and the resin film by T-wise peeling to give a value of 2.30 kg/cm which was much larger than the value of 0.58 kg/cm in a similar copper-foiled base sheet prepared without plasma treatment. Further, the base sheet prepared with the plasma treatment was subjected to the test of heat resistance in contact with a molten solder alloy to note that no noticeable change was found by contacting therewith at 260° C. for 10 seconds.

EXAMPLE 4

Nine kinds of film- or sheet-like plastic materials listed below were each subjected to the low temperature plasma treatment in the same manner as in Example 2.

| Film or sheet No. | Type of material | Thickness, μm |
|---|---|---|
| 1 | Polyester resin film | 50 |
| 2 | Polyimide resin film | 25 |
| 3 | Polyparabanic acid resin film | 25 |
| 4 | Film of a tetrafluoroethylene-hexafluoropropylene copolymer resin | 50 |
| 5 | Polycarbonate resin film | 25 |
| 6 | Polysulfone resin film | 25 |
| 7 | Polyamideimide resin film | 25 |
| 8 | Alamide paper | — |
| 9 | Glass fiber reinforced flexible epoxy resin plate | — |

The thus plasma-treated materials were each coated on one surface with either one of the following adhesives (a) to (g) in a thickness of 25 μm and an electrolytic copper foil of 35 μm thickness was bonded thereto by pressing in a hot roller followed by post-curing by heating at 150° C. for 24 hours in the case of the adhesives excepting (a) and (b).

(a) A copolymer of 72% ethylene and 28% vinyl acetate (b) An acrylonitrile-butadiene copolymeric rubber (Nippol 1001, a product by Nippon Zeon Co.)

(c) A mixture of a polyvinyl butyral and an epoxy resin (d) A nylon resin modified with an epoxy (Epikote 828)

(e) A mixture of an acrylonitrile rubber and an epoxy resin (f) A room-temperature vulcanizable silicone rubber composition (KE 42R, a product by Shin-Etsu Chemical Co.)

(g) An epoxy resin modified with cyanic acid-polybutadiene

Each of the thus prepared 63 flexible base sheets for printed circuit board was subjected to the test of the adhesive bonding strength between the copper foil and the polymeric base by T-wise peeling to give the results shown in the table below in kg/cm. In some cases, peeling of the copper foil was impossible at all and the polymeric base became destroyed by forcibly pulling the copper foil and the polymeric base apart.

For comparison, preparation and testing of 63 flexible base sheets for all of the combinations of the 9 polymeric bases and 7 adhesives were carried out in just the same manner as above excepting the omission of the low temperature plasma treatment of the film- or sheet-like polymeric base. The results of the test of the adhesive bonding strength by T-wise peeling are given also in the same table each in brackets below the value for the same combination of the adhesive and polymeric base after the low temperature plasma treatment. In some of the combinations of the polymeric base and the adhesive, no adhesive bonding could be obtained between the copper foil and the polymeric base without the low temperature plasma treatment.

| Polymeric base No. | Adhesive | | | | | | |
|---|---|---|---|---|---|---|---|
| | (a) | (b) | (c) | (d) | (e) | (f) | (g) |
| 1 | 1.45 | 1.46 | 1.75 | 2.95 | 1.85 | 1.35 | 1.51 |
| | (0.73) | (0.95) | (0.98) | (1.45) | (1.44) | (*1) | (1.20) |
| 2 | 1.49 | 1.58 | 1.91 | (*2) | 1.94 | 1.30 | 1.88 |
| | (0.45) | (0.48) | (0.75) | (0.90) | (0.78) | (*1) | (0.65) |
| 3 | 1.62 | 1.70 | (*2) | (*2) | (*2) | 1.46 | (*2) |
| | (0.56) | (0.70) | (0.81) | (0.94) | (0.85) | (*1) | (0.55) |
| 4 | 0.50 | 0.50 | 1.55 | 1.74 | 1.76 | 0.44 | 1.85 |
| | (*1) | (*1) | (*1) | (*1) | (*1) | (*1) | (*1) |
| 5 | 1.33 | 1.42 | (*2) | (*2) | (*2) | 1.25 | (*2) |
| | (0.94) | (1.05) | (1.25) | (1.30) | (1.35) | (*1) | (1.33) |

-continued

| Polymeric base No. | Adhesive | | | | | | |
|---|---|---|---|---|---|---|---|
| | (a) | (b) | (c) | (d) | (e) | (f) | (g) |
| 6 | 1.30 (0.98) | 1.35 (1.00) | (*2) (1.23) | (*2) (1.40) | (*2) (1.34) | 1.30 (*1) | (*2) (1.39) |
| 7 | 1.40 (1.10) | 1.44 (1.10) | (*2) (1.39) | (*2) (1.45) | (*2) (1.49) | 1.55 (*1) | (*2) (1.55) |
| 8 | 1.51 (1.01) | 1.57 (0.98) | (*2) (1.15) | (*2) (1.29) | (*2) (1.21) | (*2) (0.25) | (*2) (1.25) |
| 9 | 1.75 (1.30) | 1.80 (1.45) | 2.11 (1.44) | 2.34 (1.52) | 2.38 (1.32) | 1.60 (0.14) | 1.99 (1.45) |

(*1) No adhesive bonding between copper foil and polymeric base
(*2) Destruction within the polymeric base

What is claimed is:

1. A method for the preparation of a flexible base for printed circuit board composed of a flexible sheet-like polymeric base and a metal foil adhesively bonded to the polymeric base by means of an adhesive which comprises
   (a) subjecting the surface of the polymeric base to exposure to an atmosphere of low temperature plasma generated by glow discharge with application of an electric voltage of at least 4000 volts between electrodes in an atmosphere of oxygen or a gaseous mixture containing at least 10% by volume of oxygen wherein the density of the electric power in the glow discharge on the electrode is at least 2.5 watts/cm$^2$ said glow discharge being performed at a pressure between 0.001 to 10 Torr, said electrodes being spaced from each other around 1—20 cm; and
   (b) integrally bonding the metal foil to the plasma-treated surface of the polymeric base with a layer of an adhesive intervening therebetween.

* * * * *

UNITED STATES PATENT AND TRADEMARK OFFICE
CERTIFICATE OF CORRECTION

PATENT NO.    : 4,765,860
DATED         : August 23, 1988
INVENTOR(S)   : Ueno, Susumo; Kitamura, Hajime; Inoue, Kaname It is certified that error appears in the above-identified patent and that said Letters Patent is hereby corrected as shown below:

On the cover page of the patent, insert under "inventors' entry, -- Assignee: Shin-Etsu Chemical Co., Ltd., Tokyo, Japan. --.

Signed and Sealed this

Twenty-eighth Day of March, 1989

Attest:

DONALD J. QUIGG

Attesting Officer

Commissioner of Patents and Trademarks